(12) United States Patent
Tomiuchi et al.

(10) Patent No.: US 6,506,506 B1
(45) Date of Patent: Jan. 14, 2003

(54) FLUORESCENT COLOR CONVERSION FILM, FLUORESCENT COLOR CONVERSION FILTER USING THE SAME, AND AN ORGANIC LIGHT-EMITTING DEVICE EQUIPPED WITH THIS FLUORESCENT COLOR CONVERSION FILTER

(75) Inventors: Yoshimasa Tomiuchi, Kanagawa (JP); Yotaro Shiraishi, Kanagawa (JP)

(73) Assignee: Fuji Electronic Co., Ltd., Kawasaki (JP)

( * ) Notice: Subject to any disclaimer, the term of this patent is extended or adjusted under 35 U.S.C. 154(b) by 110 days.

(21) Appl. No.: 09/658,101

(22) Filed: Sep. 8, 2000

(30) Foreign Application Priority Data

Sep. 24, 1999 (JP) .......................... 11-271299

(51) Int. Cl.[7] ............................. H05B 33/00; B32B 9/00
(52) U.S. Cl. ..................... 428/690; 428/532; 428/917
(58) Field of Search ................ 428/690, 917, 428/532; 313/506, 509

(56) References Cited

U.S. PATENT DOCUMENTS

| | | | | |
|---|---|---|---|---|
| 4,926,190 A | * | 5/1990 | Laver ........................ | 346/1.1 |
| 5,098,793 A | * | 3/1992 | Rohrbach et al. ........... | 428/532 |
| 6,344,712 B1 | * | 2/2002 | Eida et al. .................. | 313/504 |

FOREIGN PATENT DOCUMENTS

| | | | |
|---|---|---|---|
| EP | 0387715 A | | 9/1990 |
| JP | 62134985 | * | 6/1987 |
| JP | 04315739 | * | 11/1992 |
| JP | 7-157752 A | | 6/1995 |
| JP | 9-106888 | | 4/1997 |
| JP | 9-115668 | | 5/1997 |
| JP | 9-208944 A | | 8/1997 |

* cited by examiner

Primary Examiner—Cynthia H. Kelly
Assistant Examiner—Dawn Garrett
(74) Attorney, Agent, or Firm—Darby & Darby

(57) ABSTRACT

A fluorescent color conversion film has an organic fluorescent dye, which absorbs light obtained from a light-emitting element in the near ultraviolet to the visible range and emits a visible light of a different wavelength, and a matrix resin, which bears the organic fluorescent dye. The organic dye is an immobilized organic fluorescent dye enclosed by a cyclodextrin derivative represented by general formula (I),

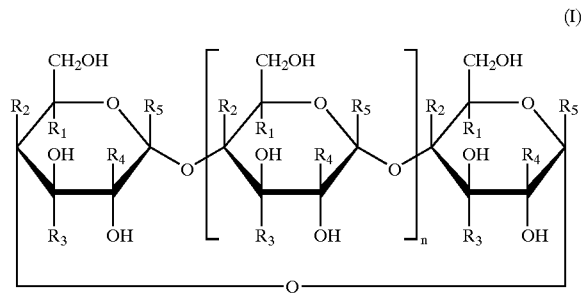

wherein n is an integer from 4 to 10, each of $R_1$–$R_5$ are selected independently from the group consisting of a hydrogen atom, a carboxyl group, a hydroxyl group, and a $C_1$–$C_6$ alkyl group. An organic light-emitting device equipped with this fluorescent color conversion film suppresses the decomposition and quenching of the fluorescent dye from attacks by radicals generated from the polymerization initiators in photolithography and/or growth radicals of reactive multi-functional monomers.

6 Claims, 1 Drawing Sheet

FLUORESCENT COLOR CONVERSION FILM, FLUORESCENT COLOR CONVERSION FILTER USING THE SAME, AND AN ORGANIC LIGHT-EMITTING DEVICE EQUIPPED WITH THIS FLUORESCENT COLOR CONVERSION FILTER

BACKGROUND OF THE INVENTION

The present invention relates to a fluorescent color conversion film for absorbing light, which is emitted from a light-emitting element in the near ultraviolet to visible range, and converting it to visible light of a different wavelength. The present invention also relates to a fluorescent color conversion filter using this fluorescent color conversion film, and to an organic light-emitting device equipped with this fluorescent color conversion filter. These fluorescent color conversion film, fluorescent color conversion filter, and organic light-emitting device are well suited for use in personal and industrial display devices, such as self-light-emitting type multi-color or full color displays, display panels, and backlights.

With increasing demand for a flat panel display instead of a conventional cathode ray tube, there has been much effort towards the development and application of various display devices. An electroluminescent device (henceforth referred to as a light emitting device) is a result of this demand. It has been gathering interest particularly because it is an all solid state light-emitting device having a high resolution and high visibility that other displays do not have.

As a method for multi-color or full colorization of a light-emitting device for use in a flat panel display, there are methods of separated arrangement of light-emitting elements of three primary colors of red, blue, green in a matrix and emitting each of these colors (disclosed in Japanese Laid-Open Patent Number 57-157487, Japanese Laid-Open Patent Number 58-147989, Japanese Laid-Open Number 3-214593). When colorizing using organic light-emitting elements, the three types of light-emitting materials for RGB must be arranged in a highly detailed matrix. This is technically difficult and cannot be manufactured cheaply. Furthermore, because the three types of light-emitting materials have differing lifespans, over time, deviation of chromaticity can arise.

Furthermore, methods, wherein: the three primary colors are transmitted using color filters on a backlight that emits white light (Japanese Laid Open Patent Number 1-315988, Japanese Laid Open Patent Number 2-273496, Japanese Laid Open Patent Number 3-194895), are also known. In order to obtain a RGB with a high luminance, a white light with a long life and high luminance is necessary, however, currently, such an organic light-emitting element has not been achieved.

A method, wherein: the luminescence from a light-emitting element is absorbed by fluorescent elements which have a separated arrangement in a plane, and from each of the fluorescent elements, fluorescent light of multiple colors is emitted (disclosed in Japanese Laid Open Patent Number 3-152897), is also known. Using fluorescent elements, this method emits fluorescence of multiple colors from a light-emitting element. This method has been applied to CRT and plasma displays.

In recent years, there has been disclosed a color conversion method, wherein fluorescent material, which can emit fluorescent light in the visible range by absorbing light in the emitted range of an organic light-emitting element, is used as a filter (Japanese Laid Open Patent Number 3-152897, Japanese Laid Open Patent Number 5-258860). Because the emitted color of the organic light-emitting element is not limited to white light, an organic light-emitting element with a higher luminance can be used as the light source. A color conversion method using an organic light-emitting element with a blue luminescence (disclosed in Japanese Laid Open Patent Number 3-152987, Japanese Laid-Open Patent Number 8-286033, Japanese Laid-Open Patent Number 9-208944) can convert the wavelength of blue light to green light or red light. With highly detailed patterning of the fluorescent color conversion film containing this kind of fluorescent dye, a full color luminescent display can be constructed even when a weak energy ray, such as near ultraviolet to visible light, of a light-emitting element is used. With regard to methods for patterning of the fluorescent color conversion film, there are (1) as with inorganic fluorescent elements, methods, wherein after dispersing fluorescent dye in a liquid resist (photoreactive polymer) and creating a film with this by spin coat method or the like, patterning is conducted by a photolithography method (Japanese Laid Open Patent Number 5-198921, Japanese Laid-Open Patent Number 5-258860), and (2) a method, wherein: fluorescent dye or fluorescent pigment is dispersed in a basic binder, and this is etched with an acidic aqueous solution (disclosed in Japanese Laid Open Patent Number 9-208944).

However, with the method of patterning by the photolithography method of the above (1), the organic fluorescent dye could decompose or become quenched. In the photolithography process of the liquid resist in which the organic fluorescent dye is dispersed, these problems are a result of attack by radicals generated from photo polymerization initiators and/or thermo-polymerization initiators (hardening agents) in the resist, or from attack by reactive multifunctional monomer growth radicals from reactive multifunctional monomers and oligomers.

Furthermore, with the method of etching by an acidic aqueous solution of the above (2), patterning is conducted after coating the resist on top of a fluorescent color conversion film, which comprises a basic binder. As a result, there are many steps in the manufacturing process. Furthermore, there are problems such as pattern thinning due to side etching, and the like. As a result, an adequate solution to the problems has not been achieved.

OBJECT AND SUMMARY OF THE INVENTION

It is an object of the present invention to provide a fluorescent color conversion filter and an organic light-emitting device equipped with this fluorescent color conversion filter which overcomes the foregoing problems.

More specifically, it is an object of the present invention to provide a fluorescent color conversion filter and an organic light emitting device equipped with this fluorescent color conversion filter in which the fluorescent color conversion filter is manufactured using a photolithography process and in which the decomposition and quenching of the fluorescent coloring matter resulting from attacks from radicals generated from polymerization initiators and/or growth radicals of reactive multifunctional monomers are suppressed.

The first embodiment of the present invention is a fluorescent color conversion film, in a fluorescent color conversion filter, comprising an organic fluorescent dye which absorbs light obtained from a light-emitting element in the near ultraviolet to visible range and emits a different visible light and a matrix resin which bears this organic fluorescent dye, herein the organic fluorescent dye is an immobilized organic fluorescent dye enclosed by a cyclodextrin derivative represented by the following general formula (I).

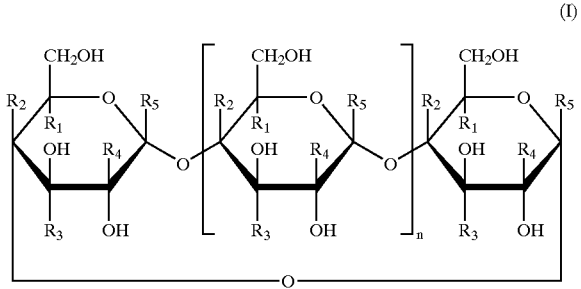

wherein n is an integer from 4 to 10, each of $R_1$~$R_5$ are selected independently from he group consisting of a hydrogen atom, a carboxyl group, a hydroxyl group, and an $C_1$ to $C_6$ alkyl group.

The second embodiment of the present invention is a fluorescent color conversion film as described in the first embodiment, wherein n is an integer from 4 to6.

The third embodiment of the present invention is a fluorescent color conversion filter comprising: a fluorescent color conversion film as described in the first or second embodiments, and a substrate.

The fourth embodiment of the present invention is an organic light-emitting device, comprising: a fluorescent color conversion filter as described in the third embodiment, and an organic light-emitting element.

An enclosure complex is a complex in which a guest molecule is captured inside an open space (henceforth referred to as inner space) formed in a host molecule. From the shape of the open space formed by the host molecule in a crystal, they are classified as cylindrical or basket-shaped. Various host molecules are known. Among these, cyclodextrin is well known as a host molecule. Cyclodextrin is a ring oligomer of glucose and has the following properties: large amounts of the pure compound can be obtained easily, the size of the inner space can be chosen by the number of glucoses, and various chemical modifications are possible. Cyclodextrin is classified as cylindrical. Because hydroxyl groups and other hydrophilic residual groups extend outward on the outside of this cylinder, the inner space has a relatively low polarity and is very hydrophobic. As a result, hydrophobic substitution groups such as phenyl groups and the like are easily taken into the inner space, and an enclosure complex is formed readily. Furthermore, because the movement of the guest molecule, which has entered in the inner space, is constrained, the conformation is limited. With respect to organic dye, it has been reported by I. R. Politzer et al that rhodamine 6G and rhodamine B, which are xanthene dyes, are enclosed by cyclodextrin, and the absorption spectrum and fluorescence spectrum become altered (Chemical Physics Letters, 159, 258 (1989)).

As described above, when patterning the liquid resist in which organic fluorescent dye is dispersed using a photolithography method, there was a problem of a decrease in color conversion efficiency due to the decomposition and/or quenching of the organic fluorescent dye because of attacks by radicals generated from photo polymerization initiators and/or thermo-polymerization initiators or from growth radicals generated from reactive multifunctional monomers and oligomers.

After intensive research by the present inventors, it was found that the enclosure of organic fluorescent dyes by the addition of cyclodextrin derivatives has a large effect in improving the resistance to the lithography process. In other words, by adding a cyclodextrin derivative which forms an enclosure complex, the organic fluorescent dye and cyclodextrin derivative form an enclosure complex. Because the cyclodextrin as the host molecule acts as a protective wall against the attacks by radicals on the organic fluorescent dye, it is thought that this enclosure complex can suppress the decomposition and quenching of the organic fluorescent dye.

The present invention is based on these discoveries. With the fluorescent color conversion filter equipped with the organic fluorescent dye and a matrix resin which bears this organic fluorescent dye, by having the organic fluorescent dye enclosed using the cyclodextrin derivative represented by the above general formula (I), the decomposition and quenching of the fluorescent dye during the photolithography process can be suppressed. A fluorescent color conversion filter and an organic light-emitting device equipped with this fluorescent color conversion filter that is highly detailed and has a high color conversion efficiency can be easily obtained. Furthermore, when trying to achieve an organic light-emitting device which emits light of the same luminance, by using a fluorescent filter with a high color conversion efficiency, the luminance of the organic light-emitting element can be reduced, and therefore, the driving voltage can be reduced.

The above, and other objects, features, and advantages of the present invention will become apparent from the following description read in conjunction with the accompanying drawings, in which like reference numerals designate the same elements.

DETAILED DESCRIPTION OF THE INVENTION

Fluorescent Color Conversion Film

1) Organic Fluorescent Dye

Figure 1:
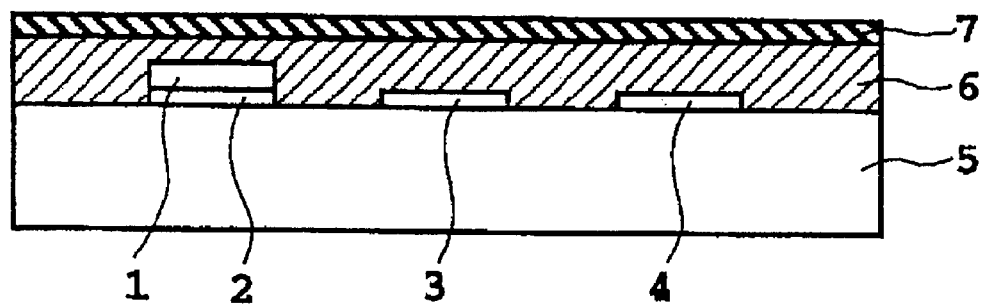
FIG. 1 is a schematic cross-sectional view showing one embodiment of a fluorescent color conversion filter of the present invention.

The organic fluorescent dye used in the present invention is one which absorbs light emitted from a light-emitting element in the near ultraviolet to visible range, particularly in the range of blue to blue-green light, and emits a visible light of a different wavelength. Preferably, the present invention uses at least one type of organic fluorescent dye that absorbs light in the blue to blue-green range and emits light in at least the red range. Or, it can be combined as needed with at least one type of fluorescent dye that emits light in the green range.

In other words, as an organic light-emitting element, it is easy to obtain an element that emits light in the blue to blue green range. However, if this is converted to light in the red range by simply passing the light through a red filter, because the light emitted by this element has only a small amount of light of wavelengths in the red range, the output light is very dark. Therefore, in the red range of light, by converting the light from this element into light in the red range by the organic fluorescent dye, an output with an adequate intensity is possible. Furthermore, for light in the green range, as with the light in the red range, the light from this element can be converted to green light by a different organic fluorescent dye, or else, if there is a sufficient amount of light in the green range emitted by this element, then the light from this element can be simply passed through a green filter. With regard to light in the blue region, it is possible to output blue light by simply passing the light from the organic light-emitting element through a blue filter.

It is preferable that the organic fluorescent dye used in the present invention has an adequate fluorescence. In other words, it is preferable that the organic fluorescent dye reaches a singlet excited state by absorbing light from the light-emitting element and has a low probability of having processes of relaxation or the like via intercrossing or oscillations. It is desirable to have emission of fluorescence with a high quantum efficiency.

Examples of organic fluorescent dyes that absorb light emitted from a light-emitting element in the blue to blue-green range and emit light in the red range include: rhodamine dye, such as rhodamine B, rhodamine 6G, rhodamine 3B, rhodamine 101, rhodamine 110, sulforhodamine, basic violet 11, and basic red 2; pyridine dye, such as 1-ethyl-2-[4-(p-dimethylaminophenyl)-1,3-butadienyl)-pyridinium-perchlorate (pyridine 1); cyanine dye, or oxazine dye. Besides, various dyes such as direct dyes, acid dyes, basic dyes, and disperse dyes can be used if they are fluorescent.

Furthermore, examples of organic fluorescent dyes that absorb light emitted from the light-emitting element in the blue to blue-green range and emit light in the green range include: coumarin dye, such as 3-(2'-benzothiazolyl)-7-diethylaminocoumarin (coumarin 6), 3-(2'-benzoimidazolyl)-7-N,N-diethylaminocoumarin (coumarin 7), 3-(2'-N-methylbenzoimidazolyl)-7-N,N-diethylaminocoumarin (coumarin 30), and 2,3,5,6-1H,4H-tetrahydro-8-trifluoromethyl quinolizine (9,9a, 1-gh) coumarin (coumarin 153), or basic yellow 51 which is a coumarin dye species, and in addition naphthalimide dye such as solvent yellow 11 and solvent yellow 116. Besides, various dyes such as direct dyes, acid dyes, basic dyes, and disperse dyes can be used if they are fluorescent.

Furthermore, the organic fluorescent dyes of the present invention can be made into fluorescent pigments by mixing in advance with ester polymethacrylate, polyvinyl chloride, vinyl chloride-vinyl acetate copolymer resin, alkyd resin, aromatic sulfonamide resin, urea resin, melamine resin, benzoguanamine resin, and resin mixtures of these. Furthermore, these organic fluorescent dyes and organic fluorescent pigments (in this specification, these two are both collectively referred to as organic fluorescent dye) can be used singly, or two or more types can be combined and used in order to adjust the hue of the fluorescence.

Based on the weight of the conversion film, the organic fluorescent coloring dye is 0.01–5 weight % and preferably 0.1–2 weight %. If the organic fluorescent dye content is less than 0.01 weight %, then an adequate wavelength conversion cannot be conducted. If the content exceeds 5 weight %, there is reduced color conversion efficiency due to the effect of concentration quenching.

2) Matrix Resin

Next, for the matrix resin used in the fluorescent color conversion film of the present invention, a photo setting or a photo- and thermo-setting resin is optically and/or thermally treated; radical species or ion seeds are generated; and the resin is polymerized or cross-linked and made insoluble and infusible. Furthermore, in order to conduct patterning of the fluorescent color conversion film, the photo-setting or photo- and thermo-setting resin, prior to hardening, is preferably soluble in organic solvent or alkaline solution. Stated more concretely, the matrix resin used in the present invention is (1) a resin in which a composition film, comprising an acrylic multifunctional monomer and oligomer containing a plurality of acroyl groups or methacroyl groups and a photo or thermo polymerization initiator, is optically or thermally treated, and photo radicals or thermo radicals are generated, and the resin is polymerized; (2) a composition, comprising ester polyvinyl cinnamate and a sensitizer, is optically or thermally treated and cross-linked; (3) a composition film, comprising a chain or a cyclic olefin and bisazide, is optically or thermally treated to generate nitrene and is cross-linked to an olefin; (4) a composition film, comprising a monomer containing an epoxy group and an acid generating agent, is optically or thermally treated to generate acid (cation) and is polymerized. In particular, the photo-setting or photo- and thermo-setting resin of (1) can be patterned with high detail and is also preferable for reliability in terms of solvent resistance, heat resistance, and the like.

3) Cyclodextrin Derivative

The cyclodextrin derivative used in the present invention is represented by the previous general formula (I). By changing the number of glucose derivatives, the cyclodextrin derivative can have the size of its inner space be optimal for the molecular size or particle diameter of the organic fluorescent dye or organic fluorescent pigment which is used. The previous general formula (I) includes the compounds of the following general formulas (I-1)~(I-12), but it is not limited to these.

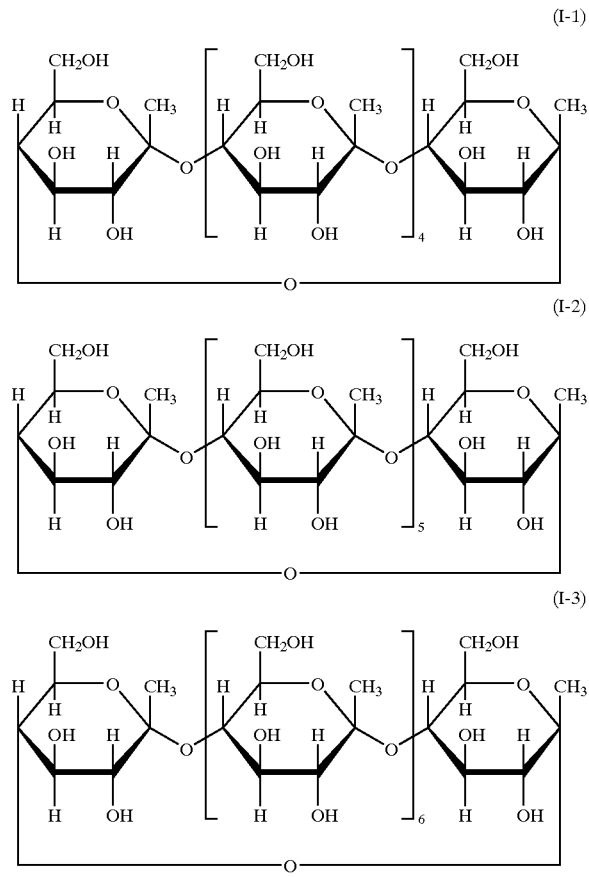

-continued (I-4)
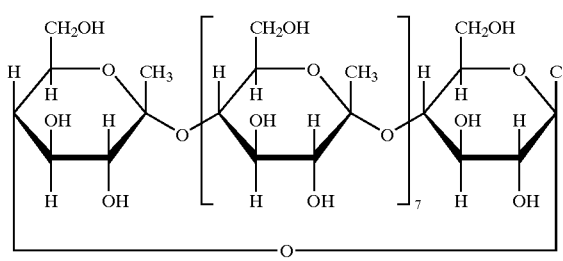

(I-9)
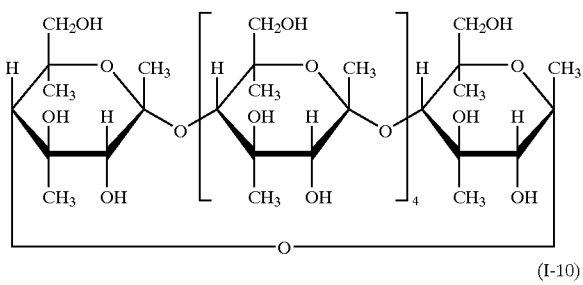

(I-5)
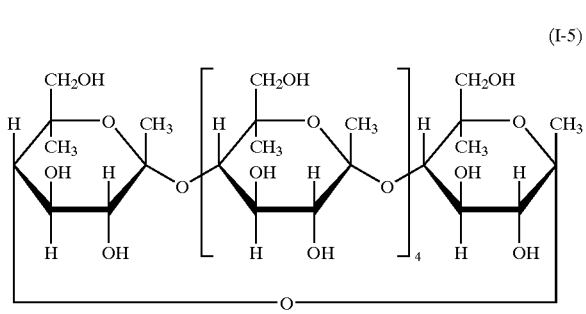

(I-10)
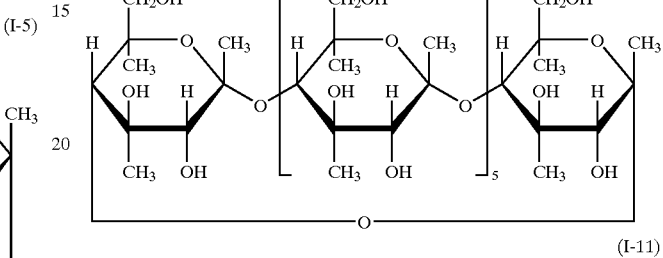

(I-6)
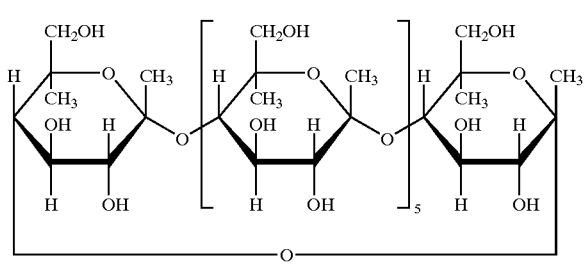

(I-11)
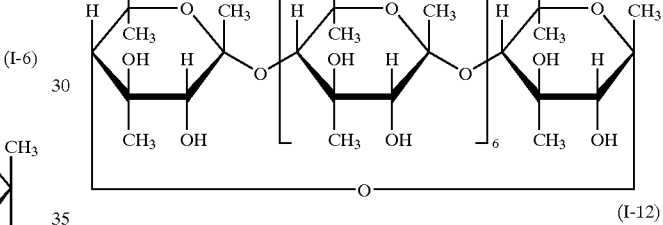

(I-7)
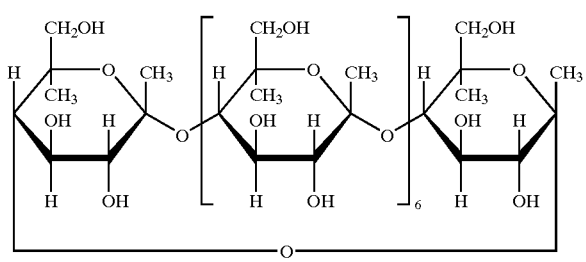

(I-12)

(I-8)
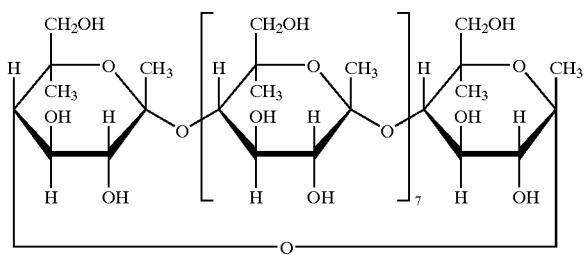

These cyclodextrin compounds are easily synthesized by standard methods. In addition, commercial products can also be obtained easily.

Although it will also depend on the organic fluorescent dye content, the cyclodextrin derivative content of the present invention with respect to the fluorescent color conversion film is 0.01~10 weight % (based on the weight of the conversion film), and preferably 0.3~6 weight %. If the cyclodextrin derivative content is less than 0.01 weight %, not all of the organic fluorescent dyer is enclosed, and as a result, there may be a reduced color conversion efficiency. On the other hand, if the content exceeds 10 weight %, there may be precipitation of the cyclodextrin derivative, or there may be changes in the chemical or physical properties of the fluorescent color conversion film, and there could be a negative impact.

4) Enclosure of the Organic Fluorescent Dye by the Cyclodextrin Derivative

In order to enclose the organic fluorescent dye of the present invention using the cyclodextrin derivative, the standard method for preparing an enclosure complex can be used. The organic fluorescent dye and the cyclodextrin derivative to be used are dissolved in a solvent that can dissolve both. By further agitation, their enclosure complex can be formed. The agitation is conducted preferably from room temperature to about 60° C., and more preferably from about 30 to 40° C. Furthermore, although it will also depend on the type of organic fluorescent dye and cyclodextrin derivative, the agitation time is preferably 10~60 minutes, and more preferably in the range of 20~40 minutes. When the organic fluorescent dye is mixed with a resin and used as a pigment, this pigment is dispersed in a solvent, and the cyclodextrin derivative is added to this dispersion solution. By further agitation, an enclosure complex of the organic fluorescent dye, which remains dissolved in the dispersion medium, can be formed.

2. Fluorescent Color Conversion Filter

The fluorescent color conversion filter of the present invention is equipped with at least the above fluorescent color conversion film and a transparent substrate. In addition, the fluorescent color conversion filter of the present invention can also have color filters, as needed.

Referring to FIG. 1, there is shown a schematic cross-sectional view showing the construction of a fluorescent color conversion filter. Referring to FIG. 1, there is shown a schematic of a portion corresponding to a single picture element of a fluorescent color conversion filter having a plurality of picture elements for use as a multi-color or full-color display.

Referring to FIG. 1, in the fluorescent color conversion filter of the present invention, a red filter layer 2 and a fluorescent color conversion film 1 are laminated on top of a transparent substrate 5. This laminate forms a specific pattern. Fluorescent color conversion film 1 is constructed from at least one type of organic fluorescent dye, which is enclosed by a cyclodextrin derivative represented by the previous general formula (I) and which emits light in the red range, and a matrix resin, which is created by photo-setting or a photo- and thermo-setting resin. Red filter layer 2 allows the red light converted by fluorescent color conversion film 1 to pass and cuts out the other colors.

In addition, a green filter layer 3 and a blue filter layer 4, each with its own specific pattern, are formed on top of transparent substrate 5. From the light radiating from the organic light-emitting element, these filter layers only transmit green light or blue light and output light of each of their respective colors. A protective layer 6 and an insulated inorganic oxide film 7 are coated on top of these filter layers, and a fluorescent color conversion filter part is constructed.

The fluorescent color conversion filter with the construction of FIG. 1 outputs light in the green range by using only a green filter layer 3. However, if needed, a fluorescent color conversion layer for green color may be provided on top of green filter layer 3.

A suitable substrate for the present invention is preferably transparent with respect to light in the visible range. It preferably also has dimensional stability. Suitable materials for the substrate include glass, quartz, sapphire, and macromolecules of polyimides and the like, but the substrate is not limited to these materials.

The fluorescent color conversion film of the present invention can be formed by coating on a suitable substrate by using known methods of spin coating, casting, immersion coating, and the like. The coating is conducted using a solution or dispersion solution containing the organic fluorescent dye enclosed by the cyclodextrin and a component which will form the matrix resin. Although it also depends on the organic fluorescent dye content, the thickness of the fluorescent color conversion film is preferably from about 0.1 to 50 micrometers, and more preferably from about 1.0 to 10 micrometers.

The patterning of the fluorescent color conversion film can be conducted using a photolithography method.

Color filters that can be used in the fluorescent color conversion filter of the present invention are used to adjust the hue of the output light of the organic light-emitting device of the present invention. In order to adjust the hue of the light which has had a wavelength conversion by the fluorescent color conversion film, a color filter is placed between the substrate and the fluorescent color conversion film. Or else, the color filter is placed in an area on top of the substrate without a fluorescent color conversion film, and the hue of the light emitted from the organic light-emitting device can be adjusted. The color filter can be manufactured using standard and commercial materials.

Furthermore, the fluorescent color conversion filter of the present invention can be further equipped as needed with a protective layer and an insulated oxide film.

The protective layer, which can be used with the fluorescent color conversion filter of the present invention, is preferably formed covering the fluorescent color conversion film and protects the conversion film from oxygen and the like. In addition, the surface opposite the side where the protective layer contacts the substrate is preferably approximately a flat plane. This is because the organic light-emitting device is provided on top of this. The protective layer is formed by using the standard resins and by the standard coating methods. The protective layer is preferably transparent in the visible range.

The insulated inorganic oxide film, which can be used in the fluorescent color conversion filter of the present invention, is preferably provided on top of the protective layer, which has an approximate flat plane surface. The insulated inorganic oxide film can be formed by standard methods of vacuum deposition, sputtering, CVD, and the like. Furthermore, the insulated inorganic oxide film is preferably also transparent to light rays in the visible range. $SiO_2$ and the like are preferred materials.

Or, the fluorescent color conversion filter of the present invention may be equipped with at minimum a transparent substrate, a color filter on top of this substrate as needed, and a fluorescent color conversion film uniformly covering the entire surface of the substrate. This can be used as a backlight. Or, the fluorescent color conversion filter of the present invention may be equipped with, at minimum, a transparent substrate, and a fluorescent color conversion film only in specified regions on top of this transparent substrate. This can be used as a display device.

3. Organic Light-Emitting Device

The organic light-emitting device of the present invention is equipped with the above described fluorescent color conversion filter and an organic light-emitting element. In other words, light from the near ultraviolet to visible range and preferably in the blue to blue-green range is emitted from the organic light-emitting element. This light enters the above fluorescent color conversion filter, and a visible light of a different wavelength is outputted from this fluorescent color conversion filter.

The organic light-emitting element has a construction, in which an organic light-emitting layer is supported between a pair of electrodes, and, if needed, a hole injection layer and electron injection layer are interposed. Stated more concretely, ones with the following layer constructions are used.

(1) anode 8/organic light-emitting layer 11/cathode 13
(2) anode 8/hole injection layer 9/organic light-emitting layer 11/cathode 13
(3) anode 8/organic light-emitting layer 11/electron injection layer 12/cathode 13
(4) anode 8/hole injection layer 9/organic light-emitting layer 11/electron injection layer 12/cathode 13
(5) anode 8/hole injection layer 9/hole transport layer 10/organic light-emitting layer 11/electron injection layer 12/cathode 13

With the above layer constructions, at least one of either the anode 8 or the cathode 13 is preferably transparent with respect to the wavelength range of the light emitted from the organic light-emitting element 11. The light is emitted through the electrode that is transparent, and the light enters the fluorescent color conversion film. In this technology, it is known that it is easy to have a transparent anode, and in the present invention, the anode is preferably transparent.

For the materials for each of the above layers, known materials are used. For example, as the organic light-emitting layer, in order to obtain blue to blue green luminescence, fluorescent whitening agents, such as benzothiazoles, benzimidazoles, benzoxazoles, and the like, and metal chelated oxonium compounds, styryl benzene compounds, aromatic dimethylidyne compounds, and the like are preferably used.

Figure 2:
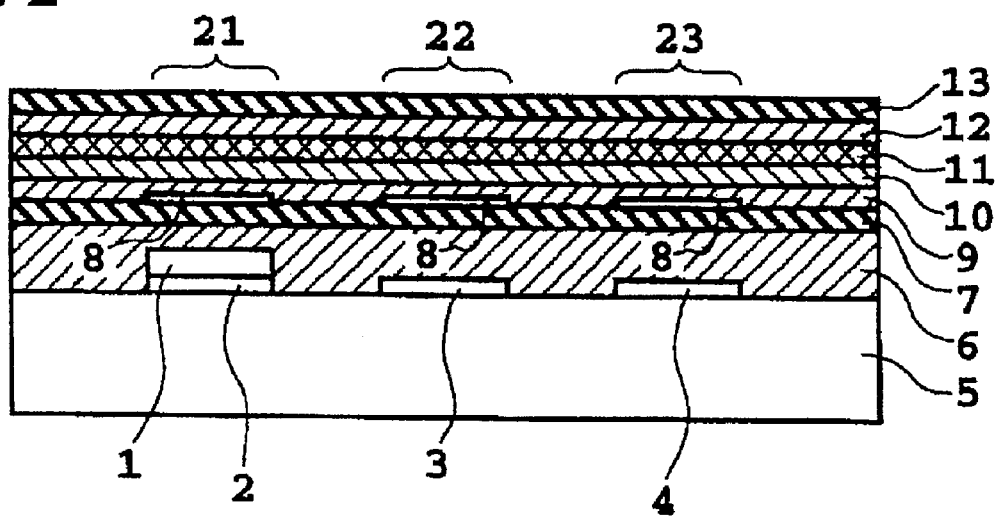
FIG. 2 is a schematic cross-sectional view showing an embodiment of an organic light-emitting device of the present invention.

Referring to FIG. 2, there is shown a schematic cross-sectional view showing the overall construction of the organic light-emitting device. Referring to FIG. 2, a portion corresponding to a single picture element of an organic light-emitting device, which is used for multicolor or full color displays and which has a plurality of picture elements, is shown.

Referring to FIG. 2, an organic light-emitting layer is formed on top of the fluorescent color conversion filter. The organic light-emitting layer is constructed from an anode 8, which is of a transparent electrode such as ITO and the like which is pattern formed on top of insulated inorganic oxide film 7; a hole injection layer 9, which covers anode 8; a hole transport layer 10, which is formed on top of hole injection layer 9; an organic light-emitting layer 11, which is formed on top of hole transport layer 10; an electron injection layer 12, which is formed on top of organic light-emitting layer 11; and a cathode 13 of a metal electrode or the like.

In the present invention, the patterns for anode 8 and cathode 13 are both parallel stripes, and they can be formed so that they intersect each other. In this situation, the organic light-emitting device of the present invention can conduct matrix driving. In other words, when voltage is applied to a specific stripe of anode 8 and a specific stripe of cathode 13, the part of organic light-emitting layer 11 where these stripes intersect lights up. Therefore, by applying voltage to the selected stripes of anode 8 and cathode 13, only the portions where the specified fluorescent color conversion film and/or filter is positioned lights up. By having the light which is emitted in this manner pass through the fluorescent color conversion film and/or filter positioned in this portion, light of each of the colors is outputted through transparent substrate 5. In other words when red luminescence part 21 (in other words, the portion corresponding to fluorescent color conversion film 1) lights up, this light is converted to red light by fluorescent color conversion film 1, and by further passing through red filter layer 2 and transparent substrate 5, a red light is outputted. Furthermore, when green luminescence part 22 (in other words, the portion corresponding to green filter layer 3) lights up, this light passes through green filter layer 3 to become only green-colored light and is outputted by passing through transparent substrate 5. Similarly, when blue luminescence part 23 (in other words, the portion corresponding to blue filter layer 4) lights up, this light passes through blue filter layer 4 to become only blue light and is outputted by passing through transparent substrate 5.

Or else, in the present invention, anode 8 can be a uniform planar electrode without any stripe patterns, and the cathode can be patterned corresponding to each picture element. In this situation, a switching element is provided corresponding to each picture element, and it becomes possible to conduct a so-called active matrix driving.

Or else, the anode and cathode can be formed entirely uniformly, and the organic light-emitting device of the present invention can be used as a backlight.

Embodiments

Embodiment 1

A fluorescent color conversion filter part as shown in FIG. 1 was constructed by the following process.

Manufacture of the Color Filter Layer

After coating a color filter red "Color mosaic CR-7001" (product name, Fuji Film Olin Corp. Ltd.) on top of a coming glass (143×112×1.1 mm) as transparent substrate 5 by spin coat method, patterning was conducted by photolithography method. A red filter layer 2, having a stripe pattern of film thickness 1 micrometer, width 0.104 mm, spacing 0.226 mm, was obtained.

Similarly, after coating color filter blue "Color mosaic CB-7001" (product name, Fuji Film Olin Corp. Ltd.) and color filter green "Color mosaic CG-7001" (product name, Fuji Film Olin Corp. Ltd.) on top of the above transparent substrate 5 by spin coat method, patterning was conducted by photolithography method. A blue filter layer 4 and a green filter layer 3, each having a stripe pattern of film thickness 1 micrometer, width 0.104 mm, spacing 0.226 mm, was obtained.

Manufacture of the Fluorescent Color Conversion Filter Layer

As the fluorescent dye, coumarin 6 (0.6 weight parts), rhodamine 6G (0.3 weight parts), and basic violet 11 (0.3 weight parts) were taken into 120 weight parts of propylene glycol monoethyl acetate (PGMEA), and 0.6 weight parts of a cyclodextrin derivative shown in formula (I-2) was added. This was agitated for 5 hours at room temperature, and dissolution and enclosing was conducted.

With the resulting enclosure complex solution, 60 weight parts of a transparent light polymerizing resin "Denacol DA-314" (product name, Nagase Kasei Kogyo Corp. Ltd.), 30 weight parts of "Aronix M-215" (product name, Toa Gosei Corp. Ltd.), 15 weight parts of "Aronix M-5700" (product name, Toa Gosei Corp. Ltd.), and 5 weight parts of benzophenone compound "Kayacure-BMs" (product name, Nihon Kayaku Corp. Ltd.) were added and dissolved, and a coating solution was prepared. This coating solution was coated on top of the above filter layer by the spin coat method. This was dried by an oven at 90° C., and a fluorescent color conversion film was obtained. Polyvinyl alcohol was coated on top of this by spin coating. This was dried, and an oxygen blocking film (not shown) was formed. Next, the resulting laminated body was exposed to a light exposure device, which has a high pressure mercury lamp as its light source, via a mask which achieves a stripe pattern of width 0.104 mm, spacing 0.226 mm. The oxygen blocking film was removed by a pure water rinse. By further development treatment with an alkaline solution, a stripe patterned fluorescent color conversion film 1 was obtained on top of the red filter layer. Next, this was heated by an oven at 160° C., and a fluorescent color conversion filter (maximum film thickness 7 micrometers), comprising a laminate of different colored filter layers (2, 3, 4) having a thickness of 1 micrometers and a fluorescent color conversion film 1 of thickness 6 micrometers which was layered on top of red filter layer 2, was obtained.

On the top surface of the fluorescent color conversion filter, a UV hardening resin (epoxy modified acrylate) was coated by spin coat method. This was irradiated by a high pressure mercury lamp, and a protective layer 6 was formed. Protective layer 6 was on top of fluorescent color conversion film 1 and had a thickness of 3 micrometer, and its top surface was flat. At this time, there was no deformation in the pattern of the fluorescent color conversion filter. Furthermore, a high temperature test was conducted at 100° C., but no deformation in the fluorescent color conversion filter and protective layer was seen. On the top surface, 300 nm of $SiO_2$ film was deposited by the sputter method, and an insulated inorganic oxide film 7 was formed over the entire surface.

Manufacture of the Organic Light-emitting Device Referring to FIG. 2, an organic light-emitting device having a six-layer construction of anode 8/hole injection layer 9/hole transport layer 10/organic light-emitting layer 11/electron injection layer 12/cathode 13 was formed on top of the fluorescent color conversion filter manufactured as described above.

First, a transparent electrode (ITO) was formed as a film by sputter method over the entire surface of the upper surface of insulated inorganic oxide film 7, which is the outermost layer of the fluorescent color conversion filter. After coating a resist agent "OFRP-800" (product name, manufactured by Tokyo Oka) on top of the ITO, patterning was conducted by the photolithography method. An anode 8, which has a striped pattern positioned at the luminescent parts for each of the colors (red 21, green 22, blue 23) and with a width 0.094 mm, spacing 0.016 mm, film thickness 100 nm, was obtained.

Next, substrate 5 on which the above anode was formed was installed inside a resistance heating vapor deposition device. Hole injection layer 9, hole transport layer 10, organic luminescent layer 11, and electron injection layer 12 were sequentially formed without breaking the vacuum. Referring to Table 1, the structural formulas for the materials used in each of the layers is shown. During film formation, the pressure inside the vacuum chamber was reduced to $1 \times 10^{-4}$ Pa. For hole injection layer 9, 100 nm of copper phthalocyanine (CuPc) was laminated. For hole transport layer 10, 20 nm of 4,4'-bis[N-(1-naphthyl)-N-phenylamino] biphenyl (alpha-NPD) was laminated. For organic luminescent layer 11, 30 nm of 4,4'-bis(2,2'-diphenylvinyl)biphenyl (DPVBi) was laminated. For electron injection layer 12, 20 nm of tris(8-quinolinolato) aluminum (Alq) was laminated.

Afterwards, substrate 5 was removed from the vacuum chamber, and a mask, which results in striped pattern, perpendicular to the lines of anode (ITO) 8 and with a width 0.30 mm, spacing 0.03 mm, was attached. After installing inside a new resistance heating vapor deposition device, a cathode 13 of a Mg/Ag (10:1 weight ratio) layer of thickness 200 nm was formed.

The resulting organic light-emitting device was sealed inside a glove box under a dry nitrogen atmosphere using sealing glass (not shown) and UV hardening adhesive.

Furthermore, the organic luminescent body inside the organic luminescent element manufactured in the above manner emits a blue-green light with a luminescent wavelength range of 430–550 nm.

TABLE 1

| Layer | Substance | Structural Formula |
| --- | --- | --- |
| Hole Injection Layer 9 | Copper phthalocyanine | |
| Hole Transport Layer 10 | 4,4'-bis[N-(1-naphthyl)-N-phenylamino] biphenyl | |

TABLE 1-continued

| Layer | Substance | Structural Formula |
|---|---|---|
| Organic Light-Emitting Layer 11 | 4,4'-bis(2,2-diphenylvinyl) biphenyl | |
| Electron Injection Layer 12 | tris(8-quinolinolato) aluminium | |

Embodiment 2

A fluorescent color conversion filter was manufactured the same as in Embodiment 1, except the 0.6 weight parts of the cyclodextrin derivative of formula (I-2) was replaced with 10 weight parts of the cyclodextrin derivative shown in formula (I-3). Furthermore, an organic light-emitting device equipped with this fluorescent color conversion filter was manufactured.

Embodiment 3

A fluorescent color conversion filter was manufactured the same as in Embodiment 1, except the 0.6 weight parts of the cyclodextrin derivative of formula (I-2) was replaced with 5 weight parts of the cyclodextrin derivative shown in formula (I-6). Furthermore, an organic light-emitting device equipped with this fluorescent color conversion filter was manufactured.

Embodiment 4

A fluorescent color conversion filter was manufactured the same as in Embodiment 1, except the 0.6 weight parts of the cyclodextrin derivative of formula (I-2) was replaced with 5 weight parts of the cyclodextrin derivative shown in formula (I-7). Furthermore, an organic light-emitting device equipped with this fluorescent color conversion filter was manufactured.

Embodiment 5

A fluorescent color conversion filter was manufactured the same as in Embodiment 1, except the 0.6 weight parts of the cyclodextrin derivative of formula (I-2) was replaced with 5 weight parts of the cyclodextrin derivative shown in formula (I-10). Furthermore, an organic light-emitting device equipped with this fluorescent color conversion filter was manufactured.

COMPARATIVE EXAMPLE 1

A fluorescent color conversion filter was manufactured the same as in Embodiment 1, except the 0.6 weight parts of the cyclodextrin derivative of formula (I-2) was not used. Furthermore, an organic light-emitting device equipped with this fluorescent color conversion filter was manufactured.

Evaluation of Embodiments 1–5 and

COMPARATIVE EXAMPLE 1

Evaluation of Embodiments 1–5 and Comparative example 1 was conducted with the red luminescent part of each of the organic light-emitting devices. Referring to Table 2, these results are summarized. The evaluation methods and results for each of the items of Table 2 will be described below.

TABLE 2

| | CIE color coordinates | | Relative conversion efficiency |
|---|---|---|---|
| | x | y | |
| Embodiment 1 | 0.65 | 0.34 | 1 |
| Embodiment 2 | 0.64 | 0.33 | 1.05 |
| Embodiment 3 | 0.65 | 0.34 | 1.02 |
| Embodiment 4 | 0.65 | 0.33 | 1.01 |
| Embodiment 5 | 0.65 | 0.33 | 0.98 |
| Comparative example 1 | 0.61 | 0.36 | 0.78 |

CIE Color Coordinates

CIE color coordinates were measured using MCPD-1000 (manufactured by Otsuka Denshi).

Relative Conversion Efficiency

For the relative conversion efficiency, the organic light-emitting device with the fluorescent color conversion filter of Embodiment 1 was lit, and the voltage at which the luminance became 50 cd/m$^2$ was made the standard voltage. The luminance obtained by applying the standard voltage to each of the organic light-emitting elements was measured. The relative conversion efficiency was compared, with Embodiment 1 having a luminance of 1.

When using a cyclodextrin derivative as an additive as in Embodiments 1–5, a red luminescence with a high color purity, and a high relative conversion efficiency was obtained. In contrast, with Comparative example 1 in which cyclodextrin was not added, it is clear that the red purity is lower and the relative conversion efficiency is also reduced.

By using the organic fluorescent dye enclosed by the cyclodextrin derivative according to the present invention, the decomposition and quenching of the organic fluorescent dye in the photolithography process is prevented. Light from the luminescent body emitted in the near ultraviolet to visible range is absorbed and is converted efficiently into a visible light of a different wavelength, for example red light and the like. In addition, a fluorescent color conversion filter which is capable of highly detailed patterning can be achieved easily and inexpensively. Furthermore, the organic light-emitting device equipped with this fluorescent color conversion filter can be used in personal and industrial display devices, such as self-light-emitting type multicolor or full color displays, display panels, backlights, and the like. Furthermore, by having this fluorescent color conversion filter, a full color organic light-emitting device display capable of low voltage driving can be manufactured.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A fluorescent color conversion film, in a fluorescent color conversion filter comprising:
   at least one organic fluorescent dye, absorbing light obtained from a light-emitting element, in the near ultraviolet to the visible range;
   said organic fluorescent dye emitting a visible light of a different wavelength;
   at least one matrix resin bearing said organic fluorescent dye;
   said organic fluorescent dye being an immobilized organic fluorescent dye enclosed by a cyclodextrin derivative represented by the following general formula (I)

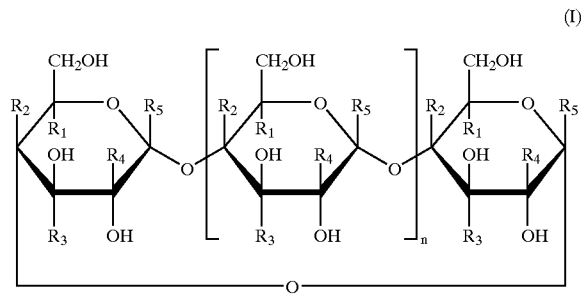

wherein n is an integer from 4 to 10, each of $R_1$–$R_5$ are selected independently from the group consisting of a hydrogen atom, a carboxyl group, a hydroxyl group, and a $C_1$–$C_6$ alkyl group.

2. The fluorescent color conversion film according to claim 1, wherein n is an integer from 4 to 6.

3. A fluorescent color conversion filter comprising:
   said fluorescent color conversion film according to claim 1; and
   a substrate.

4. A fluorescent color conversion filter comprising:
   said fluorescent color conversion film according to claim 2; and
   a substrate.

5. An organic light-emitting device, comprising:
   said fluorescent color conversion filter according to claim 3; and
   an organic light-emitting element.

6. An organic light-emitting device, comprising:
   said fluorescent color conversion filter according to claim 4; and
   an organic light-emitting element.

* * * * *

UNITED STATES PATENT AND TRADEMARK OFFICE
CERTIFICATE OF CORRECTION

PATENT NO. : 6,506,506 B1
DATED : January 14, 2003
INVENTOR(S) : Yoshimasa Tomiuchi et al.

It is certified that error appears in the above-identified patent and that said Letters Patent is hereby corrected as shown below:

<u>Title page,</u>
Item [73], Assignee, delete "Fuji Electronic Co., Ltd." and substitute
-- Fuji Electric Co., Ltd --.

Signed and Sealed this

Twenty-ninth Day of July, 2003

JAMES E. ROGAN
*Director of the United States Patent and Trademark Office*